United States Patent
Greiser et al.

(10) Patent No.: US 9,500,734 B2
(45) Date of Patent: Nov. 22, 2016

(54) MAGNETIC RESONANCE PHASE CONTRAST ANGIOGRAPHY WITH ROTATING CODING GRADIENTS

(71) Applicants: Andreas Greiser, Erlangen (DE); Peter Schmitt, Weisendorf (DE)

(72) Inventors: Andreas Greiser, Erlangen (DE); Peter Schmitt, Weisendorf (DE)

(73) Assignee: Siemens Aktiengesellschaft, Munich (DE)

( * ) Notice: Subject to any disclaimer, the term of this patent is extended or adjusted under 35 U.S.C. 154(b) by 551 days.

(21) Appl. No.: 14/036,279

(22) Filed: Sep. 25, 2013

(65) Prior Publication Data

US 2014/0084916 A1  Mar. 27, 2014

(30) Foreign Application Priority Data

Sep. 25, 2012 (DE) .................. 10 2012 217 227

(51) Int. Cl.
  *G01V 3/00* (2006.01)
  *G01R 33/563* (2006.01)
  *G01R 33/48* (2006.01)
(52) U.S. Cl.
  CPC ....... *G01R 33/5635* (2013.01); *G01R 33/4826* (2013.01); *G01R 33/56316* (2013.01)
(58) Field of Classification Search
  USPC ......................................................... 324/306
  See application file for complete search history.

(56) References Cited

U.S. PATENT DOCUMENTS

| | | | |
|---|---|---|---|
| 5,133,357 A | 7/1992 | Dumoulin et al. | |
| 6,188,922 B1 | 2/2001 | Mistretta et al. | |
| 6,954,067 B2 | 10/2005 | Mistretta | |
| 7,847,545 B2 * | 12/2010 | Wiesinger | G01R 33/243 324/306 |
| 2006/0066306 A1 | 3/2006 | Mistretta et al. | |
| 2007/0106150 A1 | 5/2007 | Greiser et al. | |
| 2008/0071167 A1 | 3/2008 | Ikedo et al. | |
| 2009/0069668 A1 | 3/2009 | Stemmer | |
| 2010/0041982 A1 | 2/2010 | Kitane | |
| 2010/0085052 A1 * | 4/2010 | Johnson | G01R 33/4824 324/309 |
| 2011/0140698 A1 | 6/2011 | Greiser | |
| 2011/0175610 A1 | 7/2011 | Griswold et al. | |
| 2013/0018252 A1 | 1/2013 | Irarrazaval | |

(Continued)

FOREIGN PATENT DOCUMENTS

JP    2011036455 A    2/2011

OTHER PUBLICATIONS

Gu et al., "PC VIPR: A High-Speed 3D Phase-Contrast Method for Flow Quantification and High-Resolution Angiography," AJNR Am J Neuroradiol, vol. 26 (2005), pp. 743-749.

(Continued)

*Primary Examiner* — Rodney Fuller
(74) *Attorney, Agent, or Firm* — Schiff Hardin LLP

(57) ABSTRACT

In a method and magnetic resonance (MR) system to generate an MR phase contrast angiography image of an examination subject, velocity-dependent phase information is impressed on moving spins in the examination subject by switching additional bipolar coding gradients that are in addition to the basic phase coding and readout gradients. For the creation of the MR phase contrast angiography images, the MR signals of the examination subject are read out in raw data space with a non-Cartesian acquisition pattern during a readout gradient. The additional bipolar coding gradients switched such that they proceed along a coordinate system that corresponds to the non-Cartesian acquisition pattern, and such that a coordinate axis of this coordinate system proceed along the readout gradient.

9 Claims, 12 Drawing Sheets

(56) References Cited

U.S. PATENT DOCUMENTS

| | | | | |
|---|---|---|---|---|
| 2014/0018666 A1* | 1/2014 | Koktzoglou | ............ | A61B 5/055 600/419 |
| 2014/0043026 A1* | 2/2014 | Frahm | ................ | G01R 33/4826 324/309 |
| 2014/0056496 A1* | 2/2014 | Kwak | ................. | A61B 5/0263 382/131 |
| 2015/0091570 A1* | 4/2015 | Gross | ................ | G01R 33/5608 324/309 |
| 2015/0097565 A1* | 4/2015 | Basha | ................ | G01R 33/4824 324/322 |

OTHER PUBLICATIONS

Bernstein et al., "Minimizing TE in Moment-nulled or Flow-encoded Two- and Three-dimensional Gradient-Echo Imaging," JMRI (1992), pp. 583-588.

* cited by examiner $x = r\cos\varphi \sin\vartheta$, $\quad r = \sqrt{x^2+y^2+z^2}$, $y = r\sin\varphi \sin\vartheta$, $\quad \vartheta = \arccos\dfrac{z}{\sqrt{x^2+y^2+z^2}}$, $z = r\cos\vartheta$, $\quad \varphi = \begin{cases} \operatorname{arccot}(x/y) & \text{for } y \geq 0 \\ \pi + \operatorname{arccot}(x/y) & \text{for } y < 0 \end{cases}$

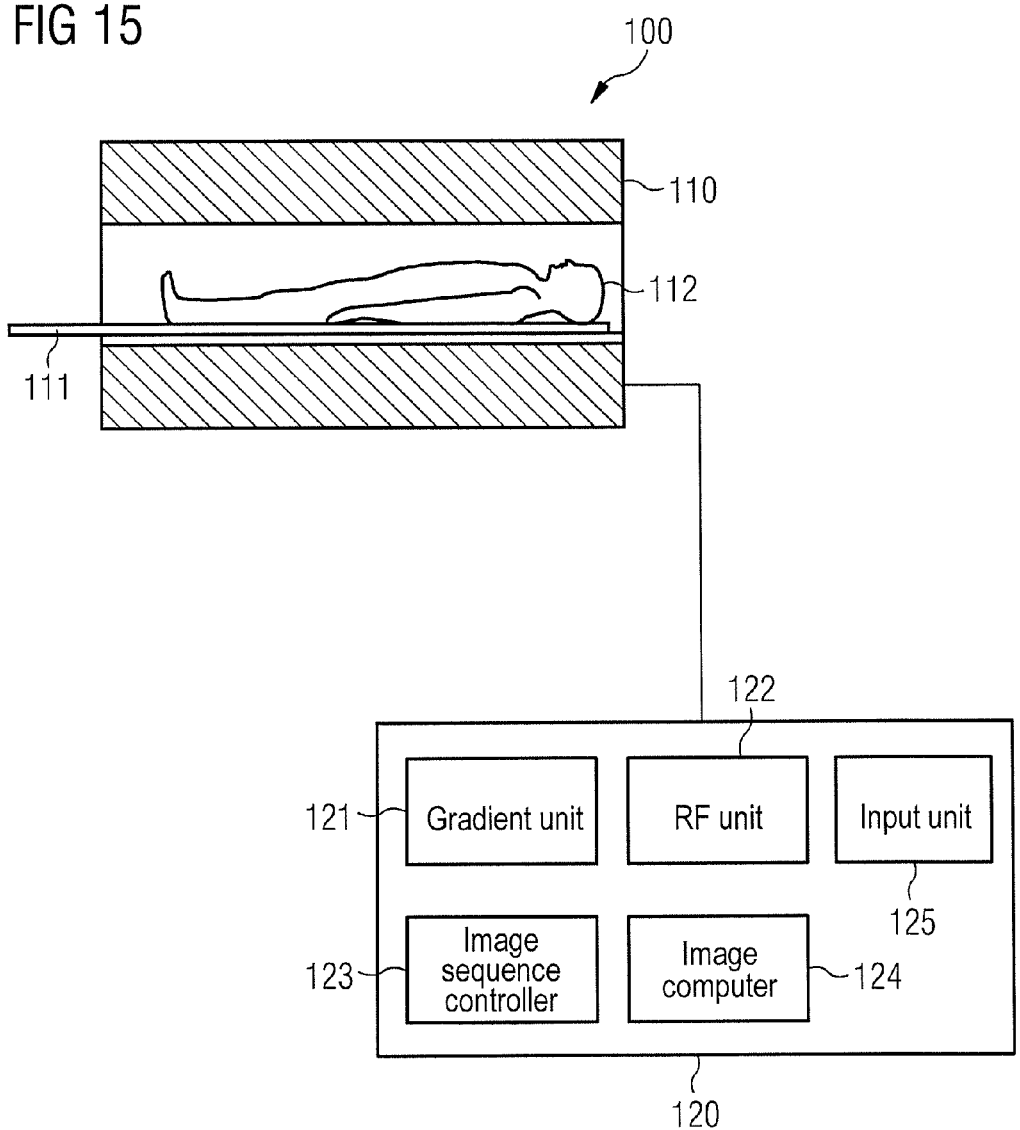

MAGNETIC RESONANCE PHASE CONTRAST ANGIOGRAPHY WITH ROTATING CODING GRADIENTS

BACKGROUND OF THE INVENTION

Field of the Invention

The present invention concerns: a method to generate a magnetic resonance (MR) phase contrast angiography image of an examination subject, in which velocity-dependent phase information is impressed on moving spins in the examination subject by activating additional bipolar coding gradients; and an MR system for implementing such a method.

Description of the Prior Art

Magnetic resonance angiography generates MR images of the vascular system of an examination subject. Two basic angiography techniques are known. The first technique is based on the phenomenon of Time of Flight (TOF) effects, in which differences in the signal saturation that exist between flowing blood and stationary tissue are used. The other technique of MR angiography is based on the fact that phase information is impressed on moving spins, which phase information differs from the phase information of non-moving spins. For this purpose, two MR images are normally acquired in phase contrast angiography technique, namely an MR image without additional (for the most part bipolar) coding gradients and an MR image with switching of the additional bipolar coding gradients. By calculating the phase difference of the two images, or by a complex difference calculation of the two images, velocity information results from the phase difference along the direction along which the additional bipolar coding gradient was switched (activated).

An image sequence given which a flow information in three different spatial directions can be generated by means of phase contrast angiography is shown in a schematically simplified manner in FIG. 1. An RF pulse 10 is activated during a slice-selection gradient 11 to excite spins in a slice. As in other imaging sequences, a phase coding gradient 12 and a readout gradient 13 are switched, wherein the signal readout takes place during a time period 14 during the readout gradients. The time period from the activation of RF pulse 10 the generated signal echo is called the echo time TE. Additional bipolar coding gradients 15, 16 and 17 can now be switched in order to respectively obtain a flow information along the spatial directions X, Y and Z. As is apparent from FIG. 1, four measurements are typically required for a three-dimensional flow information: one reference measurement without switching of additional bipolar coding gradients and a respective measurement with switching of an additional coding gradient in one of the three spatial directions. The gradient moment generated by the bipolar coding gradients is established by the maximum velocity to be coded.

Compared to the base sequence without additional coding gradients, this initially leads to an increase of the minimal echo time since the readout gradient 13 cannot be switched directly after the phase coding gradient 12; rather, a time period must additionally be provided for switching of the bipolar coding gradients. These bipolar coding gradients (also called Venc gradients) can be temporally superimposed on the gradients used for the underlying imaging sequence in order to minimize the echo time. In addition to shortening the measurement duration, thus leads to additional advantages with regard to the quality since (for example) the unwanted effect of an intravoxel dephasing (i.e. the destructive superposition of different velocity components) is reduced, whereby a signal loss due to the T*2 [sic?] decay is correspondingly reduced.

The superposition of the bipolar coding gradients with the imaging gradients can be achieved with Cartesian k-space sampling, as shown in FIG. 1. As noted, four data sets are typically created: one with flow-compensated gradient scheme without additional bipolar gradient moment, and three additional data sets with respective bipolar coding gradients spatially orthogonal to one another.

FIG. 2 shows how the flow information is acquired in the x-direction and y-direction in a two-dimensional case, wherein the readout direction always runs in the x-direction. As is apparent to the left in FIG. 2, given Cartesian coordinates the readout direction in the shown example always takes place in the x-direction. The additional bipolar phase coding gradient 17 is switched once in the x-direction, whereby a flow coding takes place in this direction, and once in the y-direction, whereby a flow coding takes place in the y-direction. A third measurement takes place without additional flow coding gradients.

It is additionally known to acquire the raw data space or, respectively, k-space belonging to an MR image with non-Cartesian k-space trajectories. In particular, a greater time efficiency is achieved via an undersampling.

The three-dimensional radial k-space sampling can also be combined with the velocity coding described above in order to achieve an efficient 3D measurement with vector flow coding as it is described in U.S. Pat. No. 6,188,922.

Such an acquisition scheme is schematically shown in FIG. 3. The coding gradients 15-17 along the three Cartesian spatial directions are maintained; however, the gradients 18, 19, 20 of the data readout are switched so that the desired (for example radial) k-space sampling is achieved. The variations of the individual gradients that are respectively shown for the gradients 18, 19, 20 should show the variation of the individual gradients for each radial k-space projection. In FIG. 4, this is shown for the two-dimensional case. For a radial readout with a trajectory 8 (in the shown case from the lower left to the upper right), the gradient switching takes place in the x-direction and y-direction of gradients 19 and 20 such that the projection 8 is achieved. As in FIGS. 2 and 3, however, the additional bipolar coding gradients furthermore take place in the fixed spatial directions x and y via switching of the additional bipolar gradients 16 and 17. As is apparent in FIGS. 3 and 4, the additional bipolar coding gradients are switched in a spatially fixed, physical xyz-coordinate system, in contrast to which the imaging sequence given a three-dimensional radial sampling includes a readout gradient rotating in a solid angle with every readout. For each projection, a gradient curve that is different in both reference systems would thus result from the temporal superposition of the spatially fixed flow coding gradients with the rotating readout gradients. This means that, in the entirety of the gradient trains that are used for a complete k-space sampling, only a single one can experience an optimization according to the minimization of TE; all other gradient curves cannot be realized in a time-optimized manner. The echo time TE is, however constant as a global measurement parameter for all measured k-space projections. This inevitably leads to an extension of the TE time in comparison to the time-optimized superposition.

This is explained in connection with FIGS. 5 through 8. In FIG. 5, the additional bipolar coding gradient is represented with 17 in dashed lines. Given a radial readout, a k-space trajectory results once that likewise takes place along the coordinate axis of $G_{read}$. This readout gradient is represented with 20 in FIG. 5. If the bipolar coding gradient 17 and the readout gradient now have the same polarity and a temporal minimization is attempted by superimposing the two gradients (as is symbolized by the arrow in FIG. 5), the image at FIG. 6 results, where the bipolar coding gradient 16 and the readout gradient 20 are superimposed. This means that—as shown in FIG. 7—a gradient switching would be necessary, as is represented by the gradients 21A and 21B. The gradients 21A and 21B correspond to the constructive superposition of the bipolar coding gradient 17 with the flow-compensated pre-gradients of the readout gradient 20. As is in particular apparent from the gradient curves 21A and 21B, to shorten an echo time a gradient strength that is very high overall is necessary, as well as a fast slew rate of the gradient. If this is not possible due to the existing gradient system, or if such a gradient switching is not desired for other reasons, as shown in FIG. 8 this can only be replaced by an extended switching of the gradient in order to achieve the same gradient moment as in FIG. 5 via the gradients 21A and 21B. This means that overall the echo time TE is extended since the gradient 22 must be switched over a longer time period in order to generate an identical gradient moment as the gradients 21A and 21B of FIG. 7. However, this leads to an extended echo time. This extended echo time occurring in a projection must then be used in all other projections since the echo time must be kept constant for all projections.

This means that, in the prior art, a lengthening of the echo time overall has been accepted.

SUMMARY OF THE INVENTION

Therefore, it is an object of the present invention to enable a phase contrast angiography in which a minimization of the echo time is possible even given non-Cartesian signal readout of k-space.

According to a first aspect of the invention, a method is provided to generate an MR phase contrast angiography of an examination subject in which a velocity-dependent phase information is impressed on moving spins in the examination subject via switching of additional bipolar coding gradients. For the creation of the MR phase contrast angiography image, the MR signals of the examination subject are read out in a raw data space with a non-Cartesian acquisition pattern during a readout gradient. According to the invention, the additional bipolar coding gradients are now switched such that they are switched along a coordinate system that corresponds to the non-Cartesian acquisition pattern, and in which a coordinate axis of this coordinate system travels along the readout gradient. This means that the additional bipolar coding gradients are not switched in a spatially fixed xyz-coordinate system but rather in a coordinate system that rotates with the readout direction. A shortening of the echo time TE—and therefore a shortening of the acquisition time—can thereby be achieved via a suitable superposition of the bipolar coding gradients with the readout gradient. The term "phase contrast angiography" can include purely angiographic presentation and, if applicable, the flow quantification that hereby takes place, i.e. the quantitative detection of the flow.

In one embodiment, one of the additional bipolar coding gradients that is directed along the readout gradient can proceed with opposite polarity relative to the readout gradient. This means that an overall smaller gradient moment is switched via the counter-polar switching of the additional bipolar coding gradients relative to the readout gradient, so lower requirements are imposed for the gradient rise time and the total level, such that the echo time can be shortened overall.

The additional bipolar coding gradient that travels along the readout gradient is advantageously switched chronologically overlapping with the readout gradient. If possible, the additional bipolar coding gradient that proceeds along the readout gradient is switched essentially simultaneously with the readout gradient. Since this proceeds counter-polar to the readout gradient, given a simultaneous switching the resulting gradient moment (which corresponds to the area under the switched gradient) can overall be very small (even zero) in the event that the gradient moment generated by the additional bipolar coding gradient and the gradient moment that is generated by the pre-gradients of the readout gradient cancel out. The echo time is hereby optimized further. In the coordinate system traveling with the readout gradient, there is a further degree of freedom of the relative angle arrangement of the bipolar coding gradient to be switched. In the two-dimensional case, these are two bipolar coding gradients orthogonal to one another; in the three-dimensional case, these are three bipolar coding gradients orthogonal to one another. The component is switched along the readout gradient so that it proceeds counter-polar to the readout gradient and advantageously chronologically overlaps with this.

For phase contrast angiography of the moving spins, a first flow information of the moving spins can furthermore be determined in the non-Cartesian (2D or 3D) coordinate system. A transformation of the determined flow information from the non-Cartesian coordinate system into the Cartesian coordinate system can subsequently take place to calculate flow components along the Cartesian coordinate system. The calculated flow components can then be represented along the Cartesian coordinate system, such that the flow information can be conventionally presented to the viewer, for example by presenting a vector map with vectors that indicate the magnitude and the direction of the flow velocity.

Furthermore, it is possible that the readout gradients or acquisition of the phase contrast angiography image fill the raw data space such that the exposures indicated by the sequence of readout gradients are reduced or, respectively, minimized. The sequence of readout gradients can hereby be chosen so that the bipolar coding gradients experience a continuous direction change or other suitable direction change (for example in pairs) in order to thus minimize possible eddy currents. For example, if a spherical raw data space is scanned with radial projections in a three-dimensional case, larger jumps in raw data space should be avoided from one projection to the other since these larger jumps correspond to large gradient changes, which would then mean increased eddy currents.

In addition to a radial raw data space sampling, other non-Cartesian samplings are also possible, for example spiral-shaped scans, rosettes or a blade or TWIRL scan.

Instead of the calculation of a phase difference from two MR data sets that are switched with a defined gradient moment for the phase coding gradients and a data set in which no bipolar coding gradient is switched at all, it is also possible to use other bipolar coding gradients, for example to use the gradient pairs $$-\frac{G_{max}}{2} \text{ and } +\frac{G_{max}}{2}$$

once instead of the bipolar coding gradient $G_{max}$ and 0 of. In the three-dimensional case, a tetrahedral arrangement of the gradient moments generated by the bipolar coding gradients can be used, for example.

Furthermore, it is possible that the additional bipolar coding gradients are switched in a spatial direction along a coordinate axis with a various gradient strengths to code different velocities. In this technique, known as a multi-venc acquisition technique, —arbitrarily many velocity sensitivities and combinations are coded in order to avoid the aliasing of velocities that are too high in phase space from −180° to +180°, for example, or also in order to enable a complete Fourier coding. Different coding gradient strengths can also be used in the various spatial directions in order to avoid aliasing artifacts in a defined spatial direction.

The invention likewise concerns an MR system for implementing such a method.

BRIEF DESCRIPTION OF THE DRAWINGS

FIG. 15 schematically illustrates an MR system according to the invention with which the control of the readout gradients and coding gradients according to the invention is possible.

DESCRIPTION OF THE PREFERRED EMBODIMENTS

Figure 1:
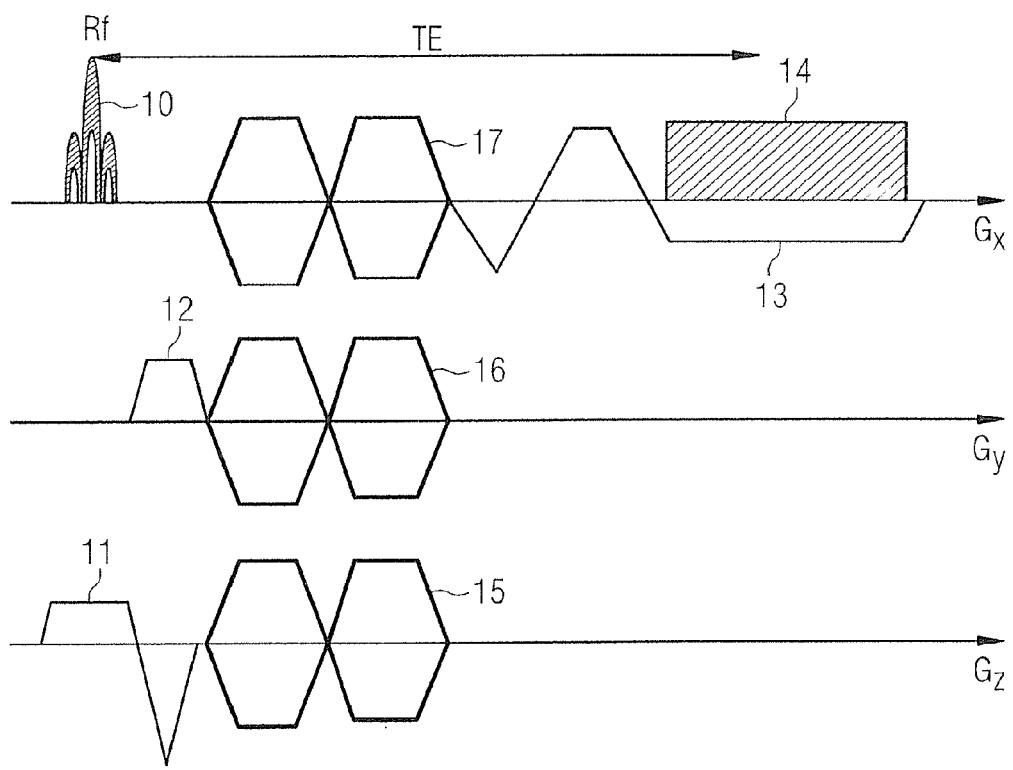
FIG. 1 schematically illustrates a gradient scheme with additional bipolar coding gradients in the three spatial directions, according to the prior art.
Figure 2:
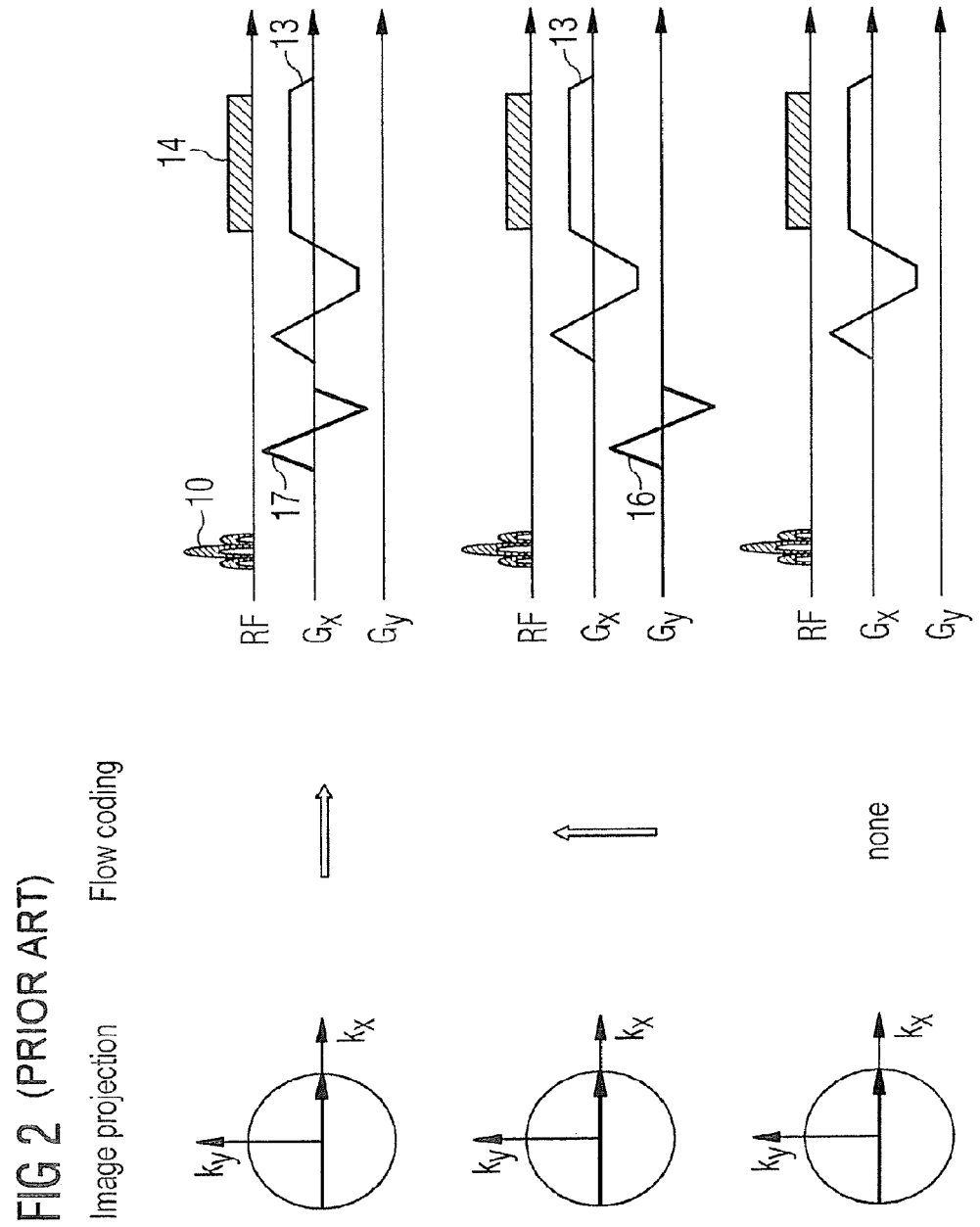
FIG. 2 shows the flow coding and the readout direction for the two-dimensional case according to the prior art.
Figure 3:
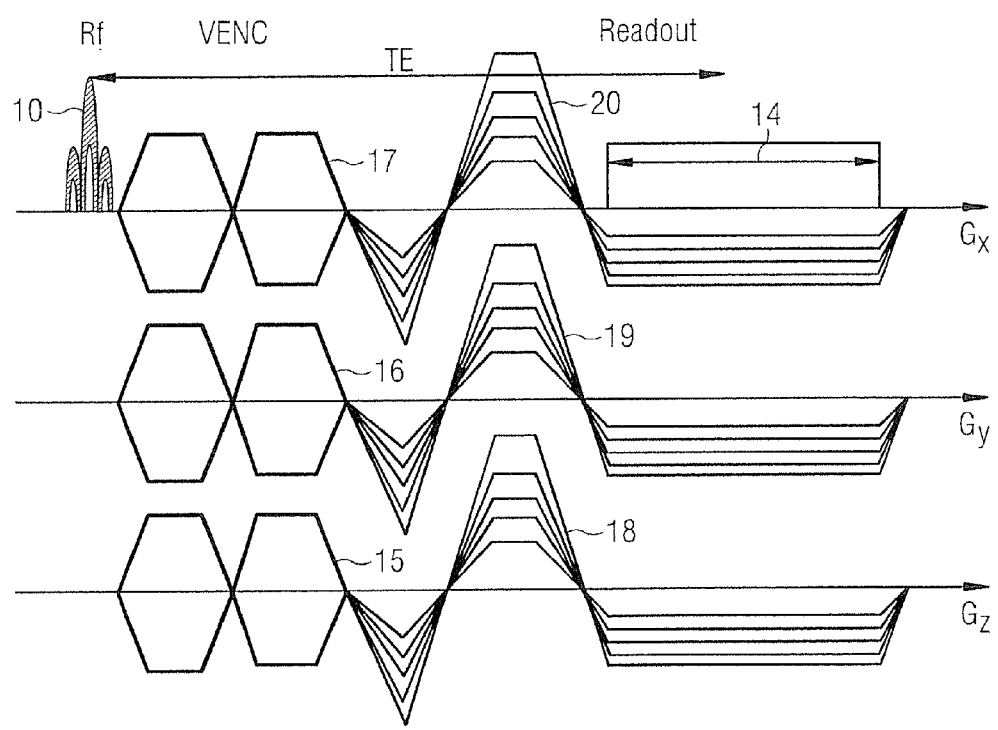
FIG. 3 shows the use of Cartesian coding gradients given non-Cartesian readout of the raw data space according to the prior art.
Figure 4:
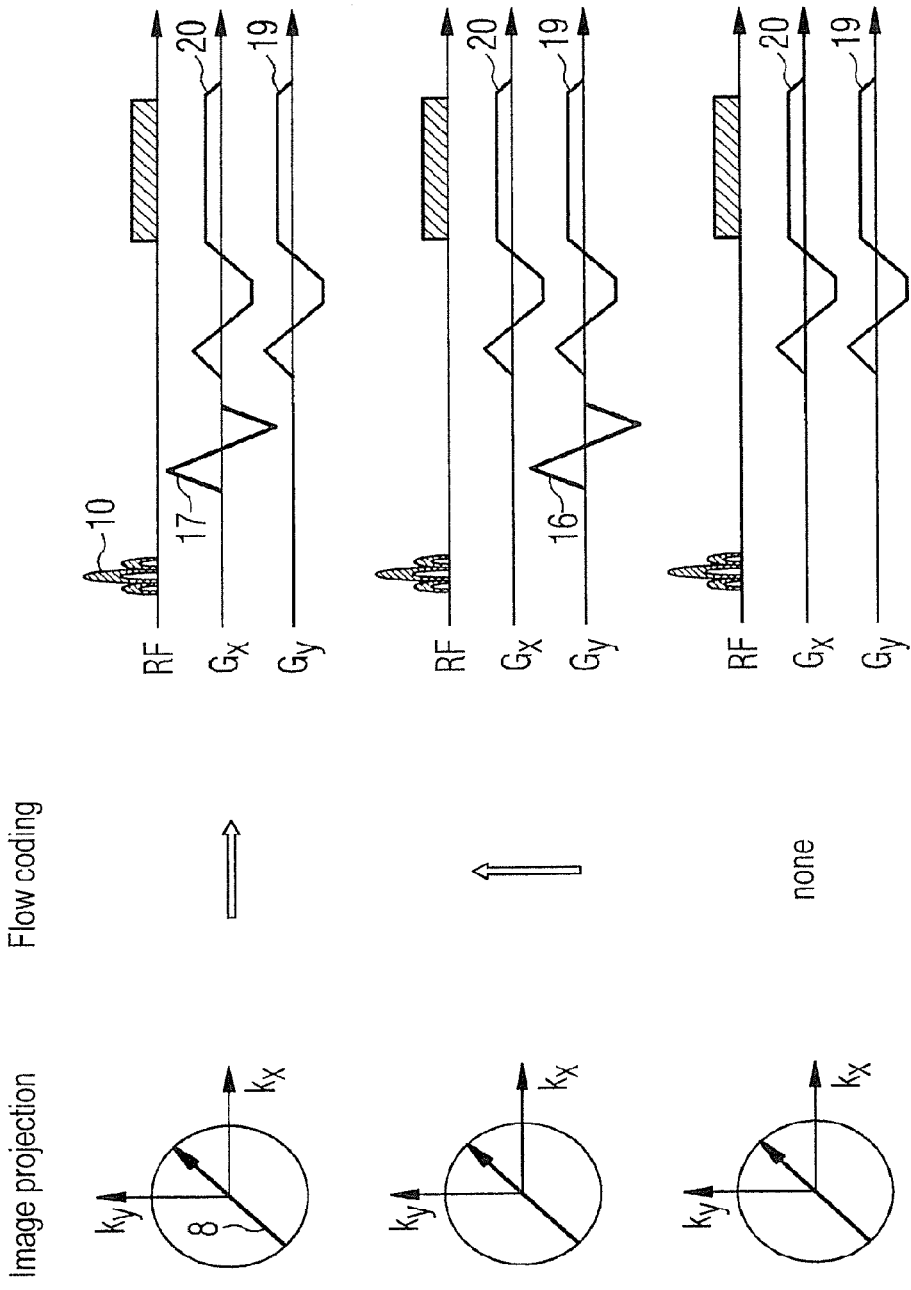
FIG. 4 shows the example of FIG. 3 in a two-dimensional case.

Schematically shown in FIG. 15 is an MR system 100 with which the time-optimized acquisition of phase contrast angiography images is possible. The MR system has a magnet 110 to generate a polarization field B0. An examination subject 112 arranged on a bed 111 is arranged in a magnet such that a resulting magnetization results in the direction of the polarization field B0. How MR signals can be detected and MR images can be generated by switching RF pulses to excite the magnetization an switching of magnetic field gradients is known to those skilled in the art and need not be explained in detail herein. How MR phase contrast angiography images are generated by calculating the difference of phase values is likewise known to those skilled in the art. The MR system has a central control system 120. A gradient unit 121 generates the gradient fields that are necessary for the generation of the phase contrast MR images. An RF unit 122 generates the RF fields to be radiated. An image sequence controller 123 controls the sequence of magnetic field gradients and RF pulses to be switched depending on the selected imaging sequence. An image computer 124 allows the calculation and presentation of MR images. An input unit 125—also called an HMI (Human Machine Interface)—enables a user of the MR system to control the workflow of the examination of the examination subject, for example by selecting imaging sequences, input of imaging parameters, etc. As is explained in detail in the following, the image sequence controller 123 subsequently controls the gradient unit 121 such that the coding gradients are switched in the same non-Cartesian coordinate system as the readout gradient.

Naturally, the MR system has additional components that are not presented in detail here and have been omitted for the sake of clarity and for a better understanding of the invention. Furthermore, the units 121-125 can be designed other than in the presented distribution; the functions controlled by the individual units can also be controlled in a different composition. Furthermore, the systems presented in FIG. 11 can be formed by hardware or software or a combination of hardware and software.

Figure 5:
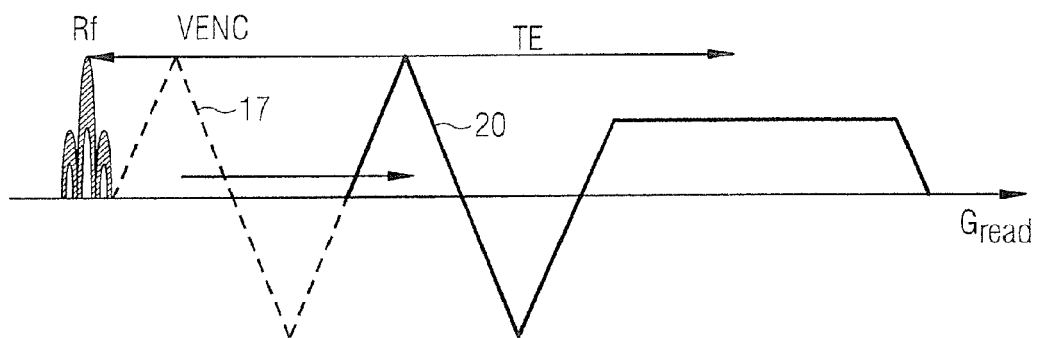
FIG. 5 schematically shows the superposition of the coding gradients with the readout gradient to minimize the echo time in the exemplary embodiment of FIG. 2.
Figure 6:
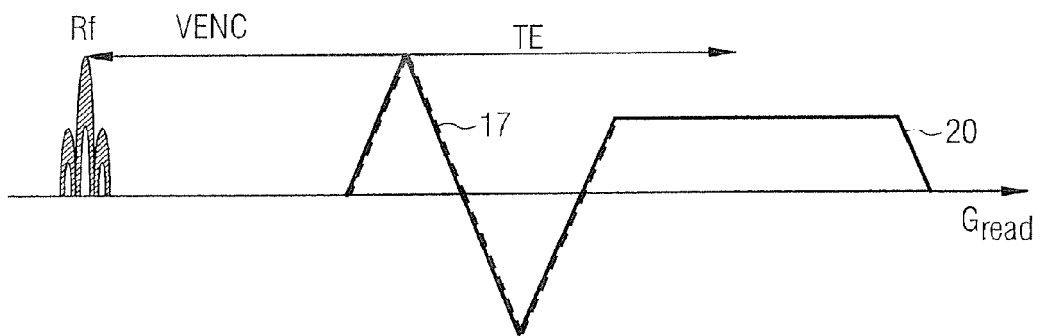
FIG. 6 shows the complete superposition of FIG. 5 that has taken place.
Figure 7:
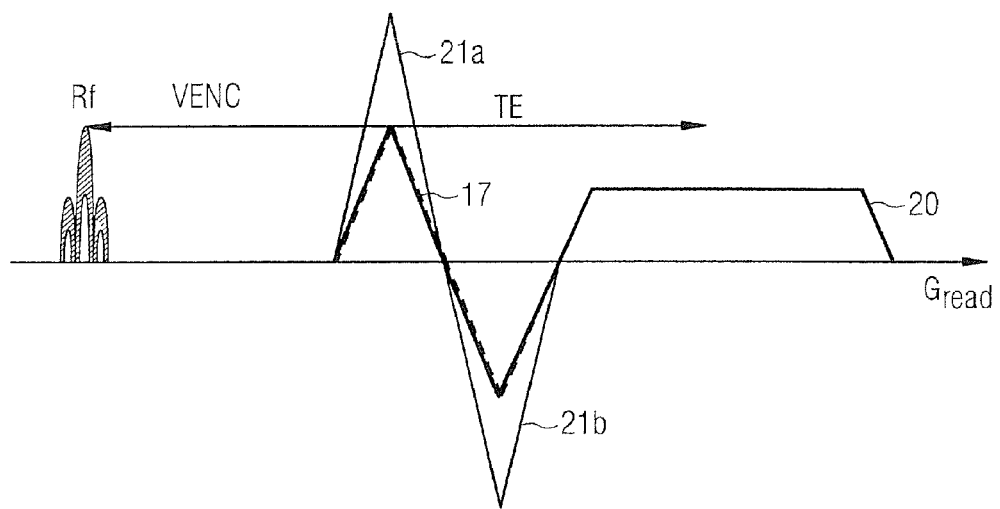
FIG. 7 shows the necessary gradient switchings from FIG. 6 that hereby result.
Figure 8:
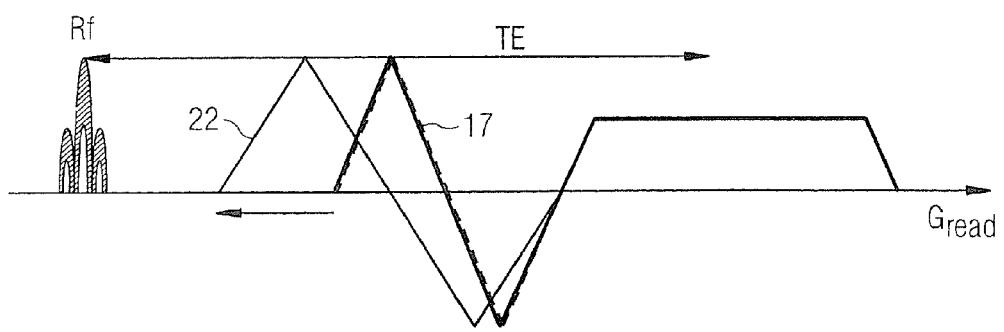
FIG. 8 shows the resulting extension of the echo time in order to obtain the same gradient moment as in FIG. 7.
Figure 9:
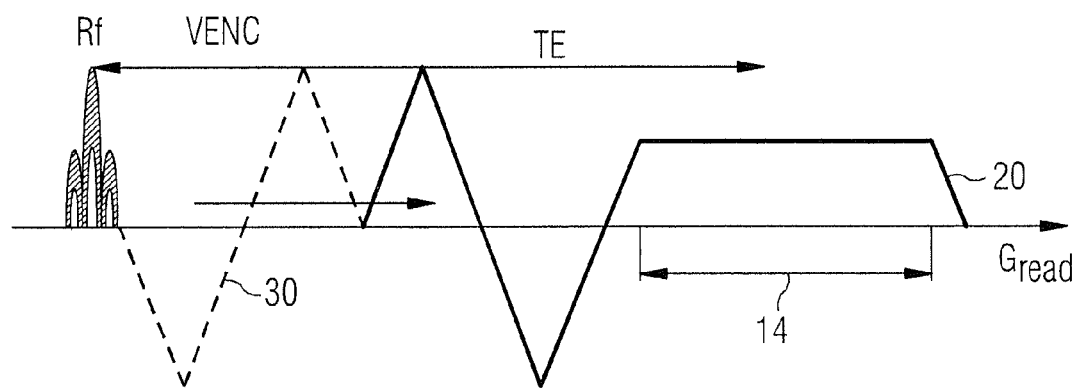
FIG. 9 shows the switching of the additional coding gradient according to the invention, which additional coding gradient proceeds with the readout gradient in the same non-Cartesian coordinate system.

The present invention is explained in detail in connection with FIG. 9. According to the invention, the bipolar coding gradient presented in FIGS. 5 and 6 (the bipolar coding gradient 30 shown with dashed lines in FIG. 9) is not switched in the spatially fixed xyz-coordinate system; rather, it travels in the direction of the readout direction of the respective readout gradient 20. The presentation that took place in FIG. 8 occurs in a rotating reference system, meaning that the readout gradient $G_{read}$ takes place along a radial trajectory that runs through the middle point of the raw data space given a radial readout of said raw data space. In the case of a rotating readout gradient (given radial signal readout), the bipolar coding gradient rotates as well. The additional bipolar coding gradient 20 is now switched so that it first travels parallel to the respective readout gradient and counter-polar to said readout gradient, i.e. counter-polar to the two gradient moments that are situated before the actual signal readout 14. The readout direction varies for each projection through the raw data space. The bipolar coding gradients now vary with each projection and are aligned with the readout direction. Since the bipolar coding gradients are aligned with the readout direction, it is always possible to respective switch the bipolar coding gradients counter-polar to the readout gradients.

This is explained in a following example of a two-dimensional radial readout of the raw data space. Each readout trajectory that proceeds through the center point of the circle is defined by the radius r and the angle φ. Instead of switching a bipolar coding gradient along the Cartesian xy-direction, the bipolar coding gradient is now aligned radially, just like the trajectory. Instead of the switching of a respective gradient in the Gx- and Gy-directions to determine the flow information in the two Cartesian spatial directions, the switching of a bipolar coding gradient takes place once in the r-direction and in a direction orthogonal to this—φ—in order to determine the two velocity components in the r-direction and p-direction. These components can then be translated into velocity components in the x-direction and y-direction via coordinate transformation.

Figure 10:
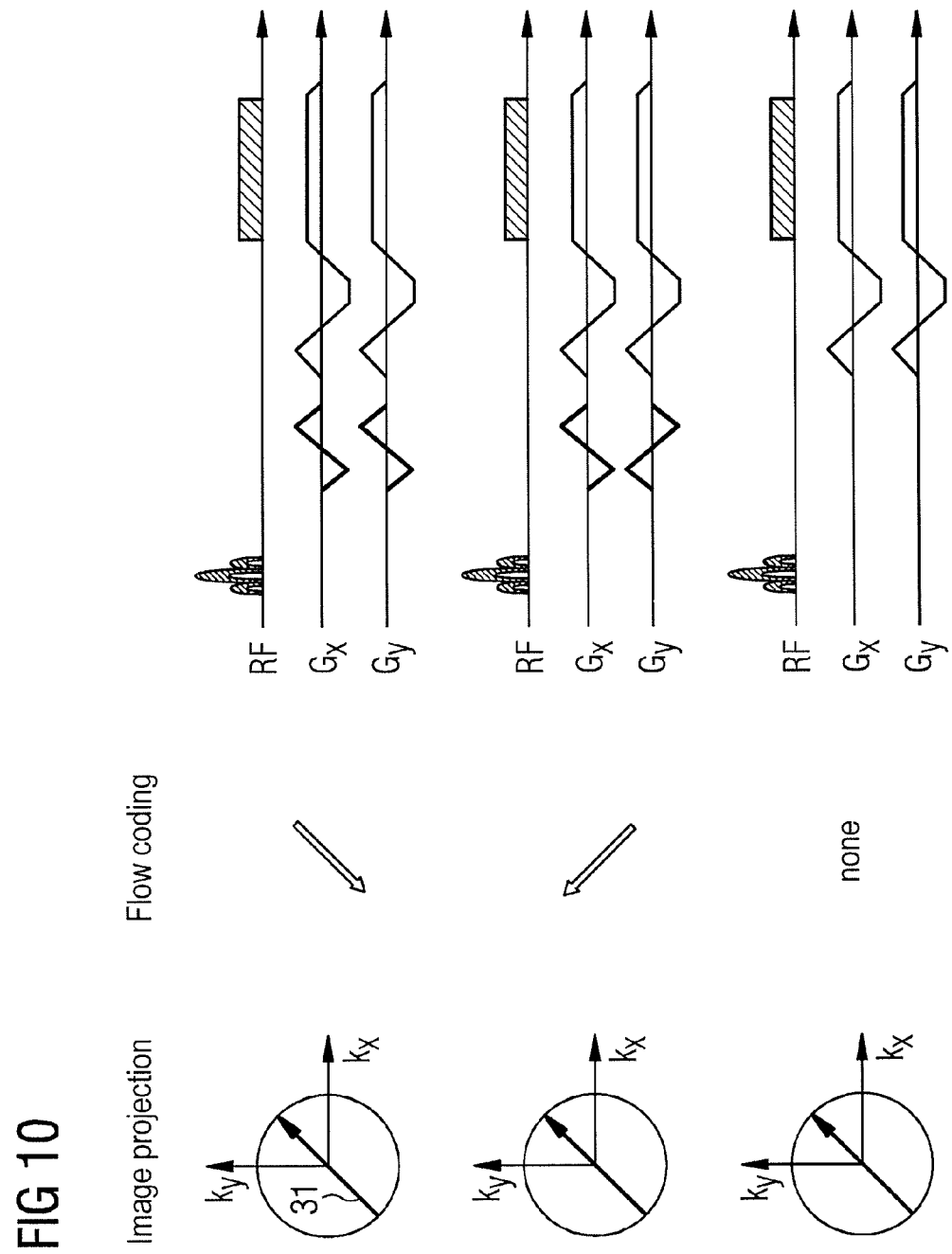
FIG. 10 shows the flow coding and the readout in the two-dimensional case for the invention.

In FIG. 10 it is now shown how the flow coding behaves relative to the image projection. While FIG. 9 presents the gradient 30 in the rotating reference system, the distribution of these gradients to the gradient systems existing in the MR system takes place in the x-direction and y-direction. If the readout direction takes place along the trajectory 31, the flow coding takes place once in parallel and opposite the readout direction and a second time orthogonal to this in order to obtain overall the entirety of the flow information in the two dimensions. As is apparent in FIG. 10, the flow coding that takes place in the direction of the image readout or image projection takes place counter to the readout direction.

Figure 11:
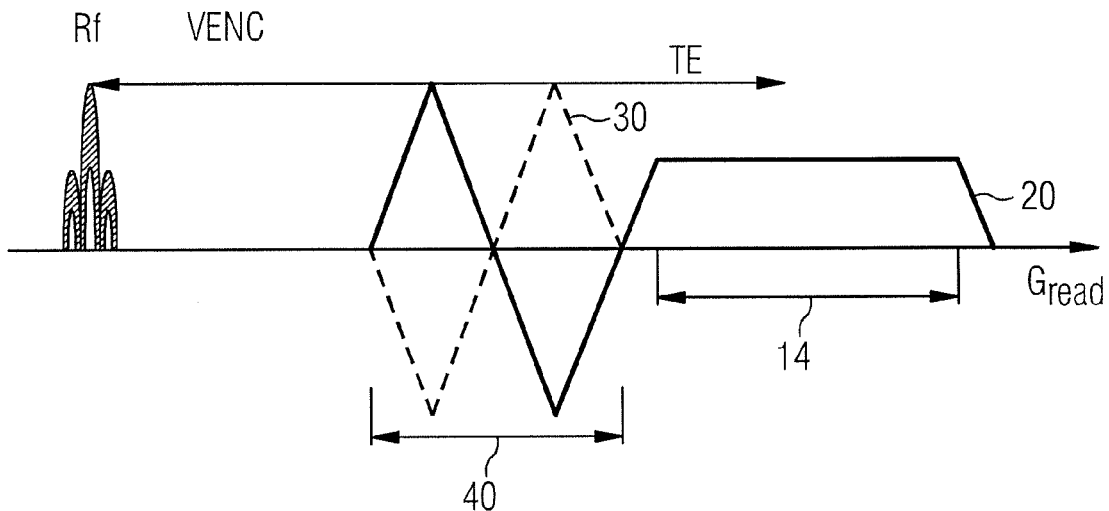
FIG. 11 shows the counter-polar switching of the coding gradient and the readout gradient to minimize the echo time.

In FIG. 11 it is now shown how a minimal echo time is achieved when the bipolar coding gradient is switched essentially simultaneously with the pre-gradients of the readout gradient. The gradient moment that is to be switched overall is the sum of the gradients during the time period 40. In the shown example, the bipolar coding gradient 30 and the gradient 20 belonging to the readout gradient have the same gradient moment during the time period 40, such that the gradient moment that is to be switched overall during the time period 40 would be zero. This means that, without switching the additional bipolar coding gradient, only the readout gradient 20 is switched once, while no gradient is switched given additional switching of the bipolar coding gradient in the time period 40. Naturally, the gradient moments of the bipolar coding gradient (which depends on the velocity to be canceled) and the gradient moment of the readout gradient must not cancel; rather, they can be of different magnitudes, such that the resulting gradient to be switched during the time period would not be zero.

In addition to the bipolar coding gradient 30 that is switched along the readout direction, for a three-dimensional velocity information two additional bipolar coding gradients (not shown) that are respectively orthogonal to the readout direction are switched in order to obtain a three-dimensional velocity information in the coordinate system that rotates together with the readout gradient.

Figure 12:
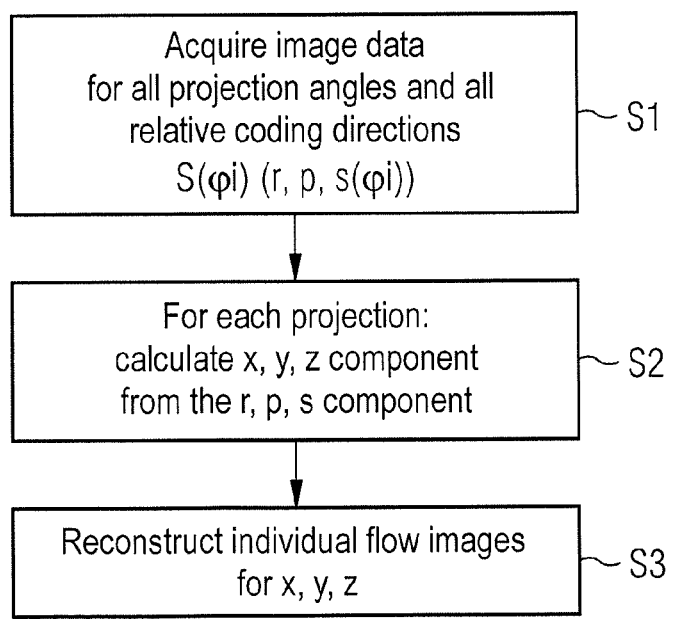
FIG. 12 is a flowchart to reconstruct individual flow images with flow information in the Cartesian spatial directions.

As shown in FIG. 11, the echo time can thus be optimized via the optimal selection of the algebraic sign of the bipolar coding gradient. The sampling of the raw data space can take place radially; however, other non-Cartesian raw data space sampling schemes are also possible, for example a spiral-shaped sampling, a rosette-shaped sampling or a TWIRL sampling in which the trajectories of an actual radial sampling are curved in an S-shape at the ends of the trajectories in order to achieve an increased sampling in outer k-space relative to the purely radial sampling. For a phase contrast angiography, the xyz components can be calculated (as is shown in the flow chart of FIG. 12, for example) from the bipolar coding gradients (two-dimensional or three-dimensional) rotating with each readout gradient and the reference measurement without coding gradient, according to the angular dependency.

Figure 13:
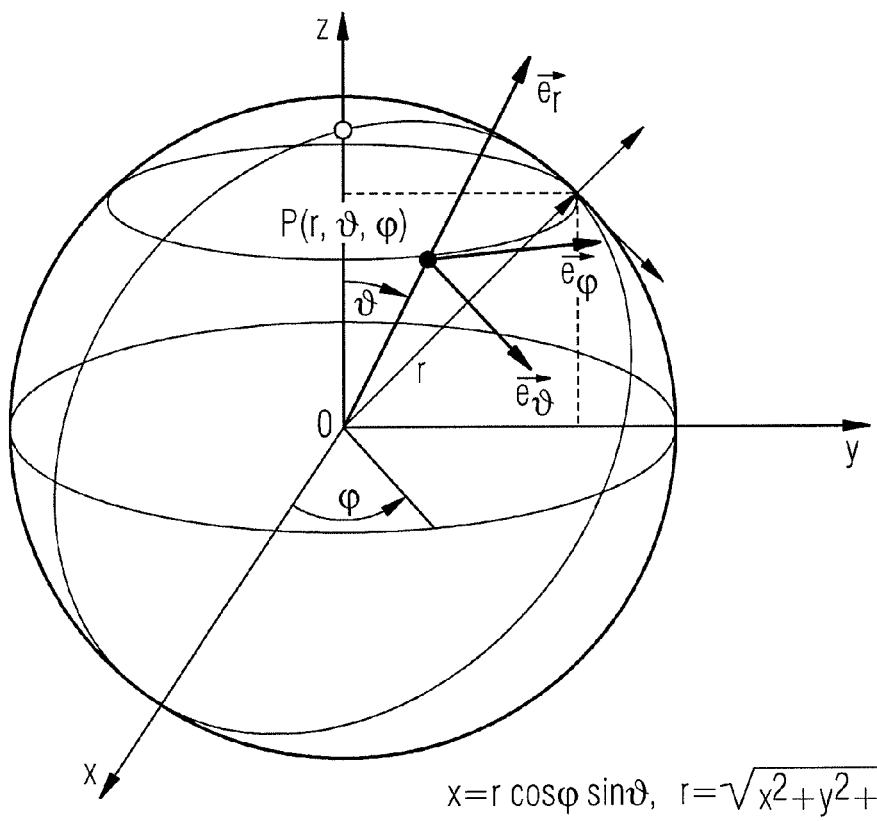
FIG. 13 shows the conversion of the flow information into a Cartesian coordinate system takes place as given a radially symmetrical three-dimensional acquisition of the raw data space.

In a first Step S1, coding image data are acquired for all relative coding directions. In the example of a spherical coordinate system with a spherical acquisition of the raw data space as shown in FIG. 13, the bipolar coding gradient directions are r, p and S ($\phi_i$), for example, wherein the index i runs across the entirety of all acquired projections/directions. Finally, in Step S2 the xyz-component is calculated from the coding components r, p and s in a spherical coordinate space for every single projection. The back-transformation from the r, θ, φ spherical coordinate system into the Cartesian coordinate system takes place with the transformations shown in FIG. 13 for spherical coordinates into Cartesian coordinates. Steps S1 and S2 do not necessarily need to proceed one after another; they can also be interleaved, such that Step S1 does not need to be concluded before Step S2 starts. Velocity-dependent phase information for xyz as it is known from phase contrast angiography (in which the coding gradients are switched in the xyz-direction) can subsequently be shown in Step S3.

The sequence of the readout projections can overall be selected so that the bipolar coding gradients themselves experience a continuous or other suitable direction change (for example a direction change in pairs) in order to thus minimize possible eddy current effects. Instead of the switching of coding gradients according to the scheme without coding gradients, coding gradients in the x-direction, coding gradients in the y-direction and coding gradients in the z-direction, it is also possible to apply other coding gradient schemes (for example a tetrahedral arrangement of the coding gradient moments) in which it is not a measurement without additional coding gradient moment that is used but rather a measurement with three gradient strengths orthogonal to one another.

Figure 14:
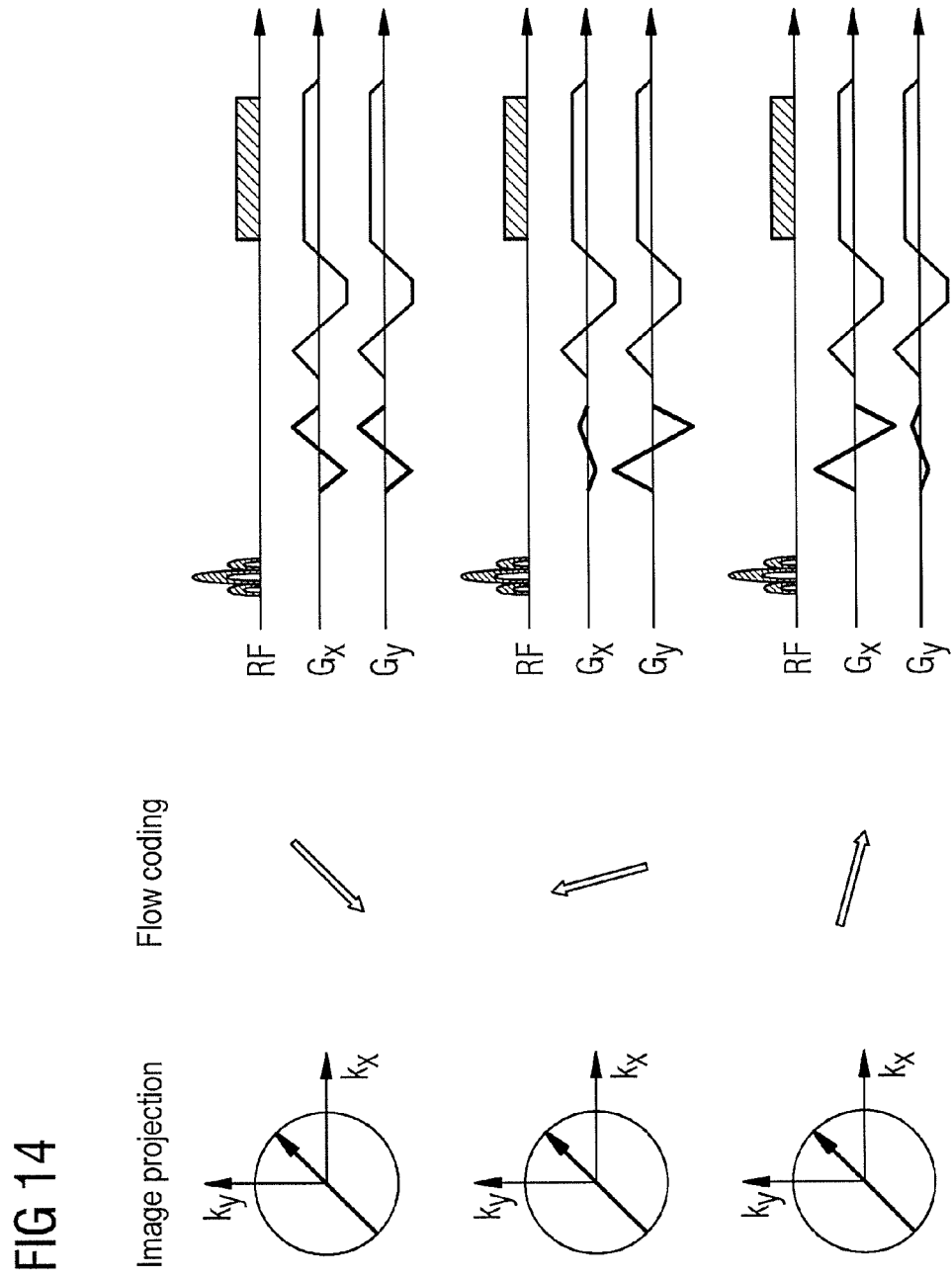
FIG. 14 illustrates an additional embodiment according to the invention.

This is explained in the two-dimensional case using FIG. 14. The data readout takes place as in FIG. 10. However, the flow coding does not take place as in FIG. 10, with two codings running orthogonal to one another and a measurement without coding; rather, the flow coding takes place with three measurements in which the flow codings point in directions situated as far apart from one another as possible. For the 2D case, here a 120 [degree] angle results between the individual flow codings. In the 3D case, a tetrahedron would result.

For the individual flow coding directions, arbitrarily many coding sensitivities and combinations can also be coded in order to avoid aliasing artifacts or in order to enable a complete Fourier coding, for example. For example, three different gradient strengths are hereby switched in one spatial direction in order to cover three different velocity ranges. It is likewise possible to associate various different sub-groups of readout gradients with the various coding gradients, for example in that all readout gradients are measured with a small coding gradient and only one sub-group is additionally measured with a greater coding gradient in order to avoid the aliasing in the associated directions.

The invention is based on the insight that a set of image acquisitions with linearly independent flow codings inherently carries the full flow information. In combination with non-Cartesian acquisition methods, this can advantageously be utilized to optimize the measurement time, i.e. to minimize the measurement time. The advantages of the invention lie in the shortening of the echo time TE. Furthermore, via conversion of the individual readout directions into xyz-coordinates before the image reconstruction, it is possible to obtain the same image data as given a method according to the prior art in which the bipolar coding gradients are switched along the Cartesian spatial directions.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to generate a magnetic resonance (MR) phase contrast angiography image of an examination subject, comprising:

operating an MR data acquisition unit, in which an examination subject is located, by executing an MR angiography pulse sequence that includes activation of a phase coding gradient and a readout gradient, and impressing velocity-dependent phase information on moving nuclear spins in the examination subject by activating additional bipolar coding gradients in said sequence;

reading out MR signals from the examination subject in said sequence in raw data space using a non-Cartesian acquisition pattern during said readout gradient, and activating said additional bipolar coding gradients along a coordinate system that corresponds to the non-Cartesian acquisition pattern, with a coordinate axis of said coordinate system proceeding along said readout gradient; and in a processor, reconstructing the MR signals in raw data space to generate an MR phase contrast angiography image of the subject, and making said MR phase contrast angiography image of the subject available at an output of the processor in electronic form as a data file.

2. A method as claimed in claim 1 comprising operating said MR data acquisition unit with said additional bipolar coding gradients proceeding along the readout gradient counter-polar to said readout gradient.

3. A method as claimed in claim 1 comprising operating said MR data acquisition unit by activating said additional bipolar coding gradients that proceed along said readout direction so as to chronologically overlap with said readout gradient.

4. A method as claimed in claim 1 comprising implementing a flow quantification of said moving spins by:

in said processor, determining first flow information of said moving spins in said non-Cartesian coordinate system;

in said processor, mathematically transforming the determined flow information into a Cartesian coordinate system and calculating flow components with respect to axes of said Cartesian coordinate system; and embodying the calculated flow components in the MR phase contrast angiography image.

5. A method as claimed in claim 1 comprising operating said MR data acquisition unit to activate readout gradients designed to enter said MR signals into said raw data space with eddy currents induced by said readout gradients being reduced.

6. A method as claimed in claim 1 comprising operating said MR data acquisition unit to enter said MR signals into a three-dimensional raw data space.

7. A method as claimed in claim 6 comprising operating said MR data acquisition unit to activate said additional bipolar coding gradients with a tetrahedral organization of gradient moments generated by the additional bipolar coding gradients.

8. A method as claimed in claim 1 comprising operating said MR data acquisition unit to activate said additional bipolar coding gradients in a spatial direction along a coordinate axis of said coordinate system with respectively different gradient strengths for coding respectively different velocities of said moving spins.

9. A magnetic resonance (MR) apparatus comprising:

an MR data acquisition unit;

a control unit configured to operate the MR data acquisition unit, in which an examination subject is located, by executing an MR angiography pulse sequence that includes activation of a phase coding gradient and a readout gradient, and impressing velocity-dependent phase information on moving nuclear spins in the examination subject by activating additional bipolar coding gradients in said sequence;

said control unit being configured to operate the MR data acquisition unit to read out MR signals from the examination subject in said sequence in raw data space using a non-Cartesian acquisition pattern during said readout gradient, and to activate said additional bipolar coding gradients along a coordinate system that corresponds to the non-Cartesian acquisition pattern, with a coordinate axis of said coordinate system proceeding along said readout gradient, and to enter said MR signals in raw data space in an electronic memory; and a processor configured to access said memory and to reconstruct the MR signals in raw data space to generate an MR phase contrast angiography image of the subject, and to make said MR phase contrast angiography image of the subject available at an output of the processor in electronic form as a data file.

* * * * *